(12) United States Patent
Nishi et al.

(10) Patent No.: US 9,287,192 B2
(45) Date of Patent: Mar. 15, 2016

(54) SEMICONDUCTOR DEVICE AND METHOD FOR MANUFACTURING SEMICONDUCTOR DEVICE

(71) Applicant: KABUSHIKI KAISHA TOYOTA JIDOSHOKKI, Aichi-ken (JP)

(72) Inventors: Shinsuke Nishi, Kariya (JP); Shogo Mori, Kariya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 0 days.

(21) Appl. No.: 13/775,718

(22) Filed: Feb. 25, 2013

(65) Prior Publication Data

US 2013/0228909 A1  Sep. 5, 2013

(30) Foreign Application Priority Data

Mar. 1, 2012  (JP) ................. 2012-045893

(51) Int. Cl.
*H01L 23/34* (2006.01)
*H01L 21/56* (2006.01)
(Continued)

(52) U.S. Cl.
CPC ............. *H01L 23/34* (2013.01); *H01L 21/56* (2013.01); *H01L 23/473* (2013.01); *H01L 24/40* (2013.01); *H01L 24/41* (2013.01); *H01L 23/3107* (2013.01); *H01L 24/29* (2013.01); *H01L 24/32* (2013.01); *H01L 24/48* (2013.01); *H01L 24/49* (2013.01); *H01L 24/73* (2013.01); *H01L 24/83* (2013.01); *H01L 24/85* (2013.01); *H01L 25/072* (2013.01); *H01L 2224/291* (2013.01); *H01L 2224/32225* (2013.01); *H01L 2224/37147* (2013.01); *H01L 2224/40139* (2013.01); *H01L 2224/40225* (2013.01); *H01L 2224/40227* (2013.01); *H01L 2224/41051* (2013.01); *H01L 2224/45139* (2013.01);
(Continued)

(58) Field of Classification Search
USPC .................. 257/691, 706, 707, 714, 787
See application file for complete search history.

(56) References Cited

U.S. PATENT DOCUMENTS 5,801,435 A  9/1998  Otsuki
6,483,185 B1 *  11/2002  Nagase et al. ............... 257/706
(Continued)

FOREIGN PATENT DOCUMENTS

| CN | 1136711 | 11/1996 |
|---|---|---|
| JP | 2007-329163 | 12/2007 |
| JP | 2008-263210 | 10/2008 |
| JP | 2010-177453 | 8/2010 |
| JP | 2012-028703 | 2/2012 |

OTHER PUBLICATIONS

U.S. Appl. No. 13/834,766 to Shinsuke Nishi et al., filed Mar. 15, 2013.

(Continued)

*Primary Examiner* — Sheila V Clark
(74) *Attorney, Agent, or Firm* — Greenblum & Bernstein, P.L.C.

(57) ABSTRACT

A semiconductor device includes a cooling device, an insulating substrate, a semiconductor element, an external connection terminal, and a resin portion. The insulating substrate is brazed to an outer surface of the cooling device. The semiconductor element is brazed to the insulating substrate. The external connection terminal includes a first end, which is electrically connected to the semiconductor element, and an opposite second end. The resin portion is molded to the insulating substrate, the semiconductor element, the first end of the external connection terminal, and at least part of the cooling device.

7 Claims, 6 Drawing Sheets

(51) Int. Cl.
*H01L 23/473* (2006.01)
*H01L 25/07* (2006.01)
*H01L 23/31* (2006.01)
*H01L 23/00* (2006.01)

(52) U.S. Cl.
CPC ............ *H01L 2224/48227* (2013.01); *H01L 2224/49175* (2013.01); *H01L 2224/73221* (2013.01); *H01L 2224/73263* (2013.01); *H01L 2224/73265* (2013.01); *H01L 2224/83424* (2013.01); *H01L 2224/85447* (2013.01); *H01L 2924/13055* (2013.01); *H01L 2924/15747* (2013.01); *H01L 2924/15787* (2013.01); *H01L 2924/181* (2013.01)

(56) References Cited

U.S. PATENT DOCUMENTS 7,839,641 B2 * 11/2010 Baba et al. .................... 361/711
2002/0041023 A1 4/2002 Sakamoto et al.

OTHER PUBLICATIONS

Office Action from Japan Patent Office (JPO) in Japanese Patent Application No. 2012-045893, dated Oct. 1, 2014.
China Office Action from State Intellectual Property Office (SIPO) in Chinese Patent Application No. 201310060118.9, dated Mar. 27, 2015, along with an English language translation thereof.

* cited by examiner

SEMICONDUCTOR DEVICE AND METHOD FOR MANUFACTURING SEMICONDUCTOR DEVICE

BACKGROUND OF THE INVENTION

The present invention relates to a semiconductor device and a method for manufacturing a semiconductor device.

Japanese Laid-Open Patent Publication No. 2008-263210 discloses a power semiconductor device provided with a first lead, which includes a first die pad, a power chip, which is arranged on an upper surface of the first die pad, and an insulating seat, which is applied to a lower surface of the first die pad. The power semiconductor device is also provided with a second lead, which includes a second die pad, a control chip, which is arranged on the second die pad, a wire, which connects the power chip and the control chip and of which the main component is gold, and a molded resin portion. The control chip and the power chip are embedded in the resin portion so that an end of the first lead and an end of the second lead project from the resin portion. The insulating seat has a higher heat conductivity than the resin portion.

Referring to FIG. 9, a power semiconductor element may be mounted on a substrate and a resin portion may be molded on the substrate to form a semiconductor module 100. This increases the reliability of the element during a power cycle. To cool the power semiconductor element, which generates heat, by fixing the semiconductor module 100 to a heat dissipation member 101 (heat sink or the like), for example, a bracket 102 that applies urging force F is required to be fixed to the heat dissipation member 101. In this case, silicone grease 103 is filled in a gap formed between the heat dissipation member 101 and the semiconductor module 100 (e.g., gap formed by bending of the substrate). The silicone grease 103 has low heat conductivity and thus hinders cooling. Further, the use of the bracket 102 to fix the semiconductor module 100 enlarges the entire device.

SUMMARY OF THE INVENTION

It is an object of the present invention to provide a semiconductor device and a method for manufacturing a semiconductor device that increase the reliability of element portions joined by a molded resin portion, achieves a high cooling capability, and allows for reduction in size.

To achieve the above object, one aspect of the present invention is a semiconductor device provided with a cooling device including a coolant passage. An insulating substrate is brazed to an outer surface of the cooling device. A semiconductor element is soldered to the insulating substrate. An external connection terminal includes a first end, which is electrically connected to the semiconductor element, and an opposite second end. A resin portion is molded to the insulating substrate, the semiconductor element, the first end of the external connection terminal, and at least part of the cooling device.

A further aspect of the present invention is a method for manufacturing a semiconductor device. The method includes forming a cooling device by joining a first shell plate and a second shell plate. The first shell plate includes a peripheral portion and the second shell plate includes a peripheral portion, which is brazed together with the peripheral portion of the first shell plate. The method further includes brazing the first shell plate and an insulating substrate together to join the first shell plate and the insulating substrate; mounting a semiconductor element on the insulating substrate; soldering the semiconductor element and a first end of an external connection terminal together to join the semiconductor element and the external connection terminal; and molding a resin portion on the insulating substrate, the semiconductor element, the first end of the external connection terminal, and at least part of the first shell plate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE INVENTION

A vehicle inverter according to one embodiment of the present invention will now be described with reference to the drawings.

Figure 1A:
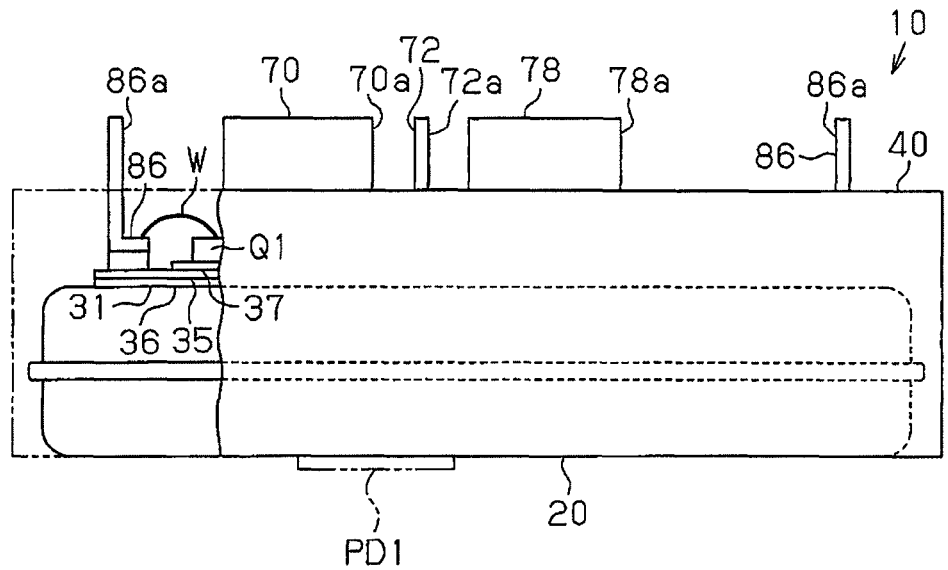
FIG. 1A is a front view of an inverter module according to one embodiment of the present invention.
Figure 1B:
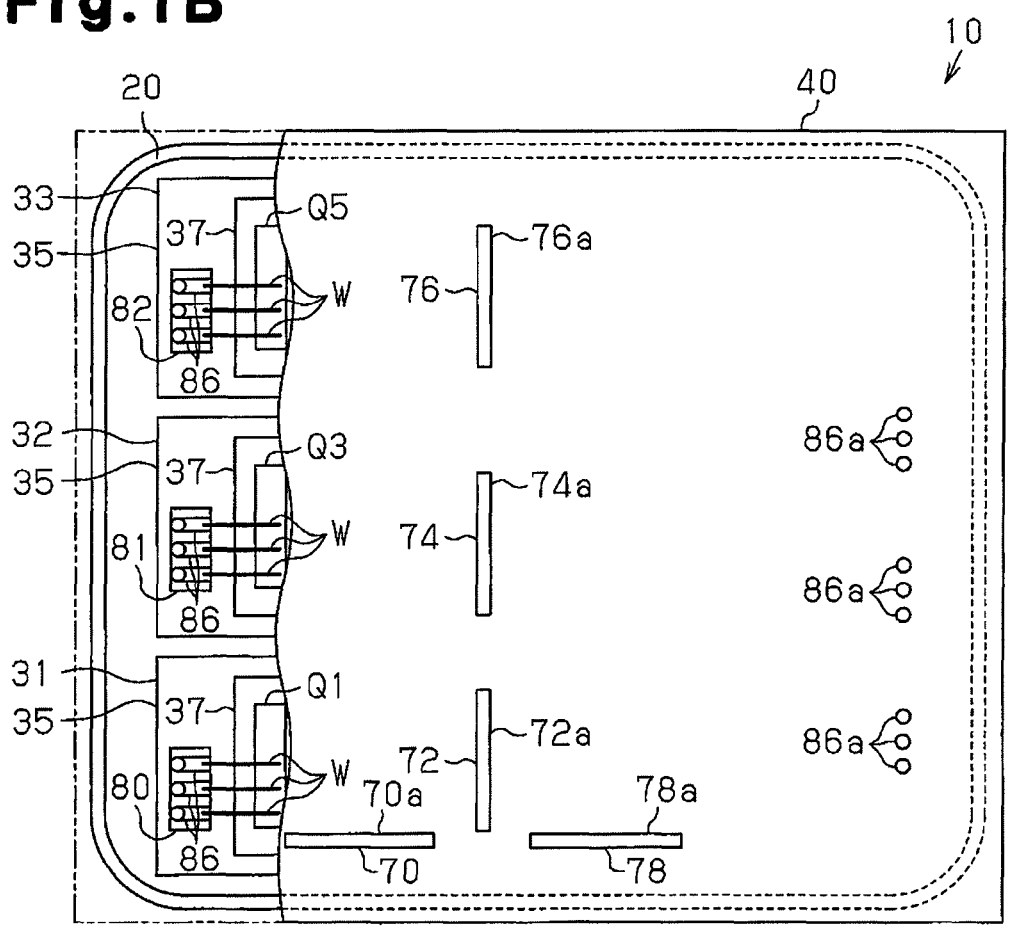
FIG. 1B is a plan view of the inverter module shown in FIG. 1A.
Figure 2A:
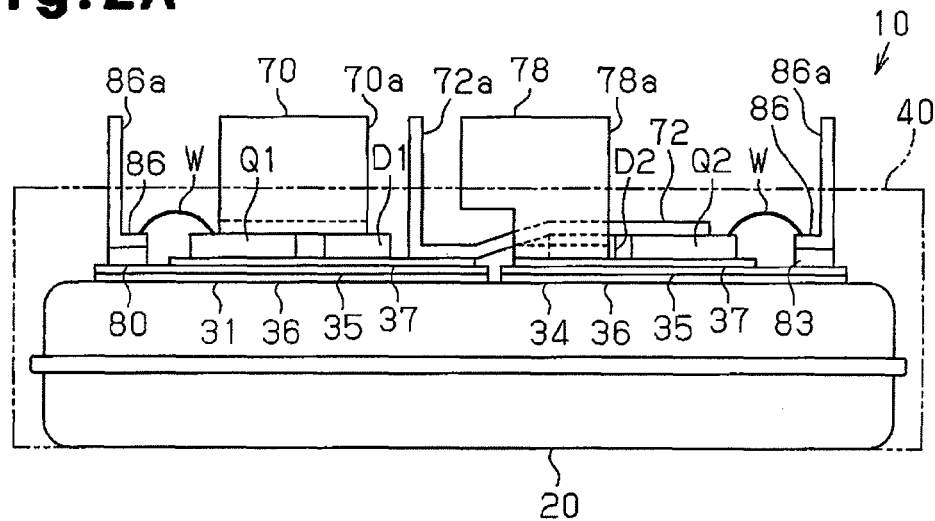
FIG. 2A is a front view of the inverter module shown in FIG. 1A in a state in which a resin portion is eliminated.
Figure 2B:
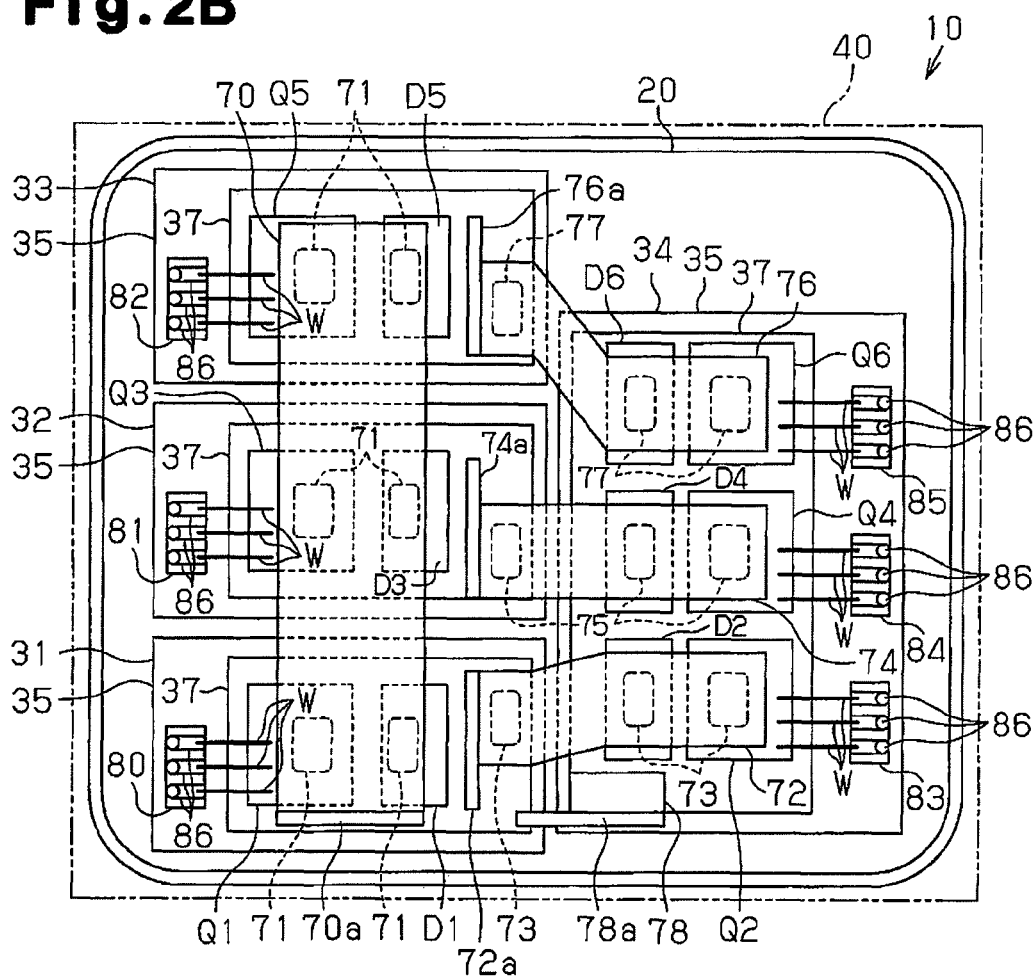
FIG. 2B is a plan view of the inverter module shown in FIG. 1A in a state in which the resin portion is eliminated.

Referring to FIGS. 1A and 1B, an inverter module 10 includes a cooling device. The inverter module 10 is resin-molded and includes substrates on which semiconductor elements (chips) are mounted. As shown in FIGS. 1A to 2B, the inverter module 10 includes a water-cooling type cooling device 20, four insulating substrates 31, 32, 33 and 34, six transistors (chips) Q1, Q2, Q3, Q4, Q5, and Q6, six diodes (chips) D1, D2, D3, D4, D5, and D6, and a molded resin portion 40. The resin portion 40 may be formed from, for example, epoxy resin.

Figure 3:
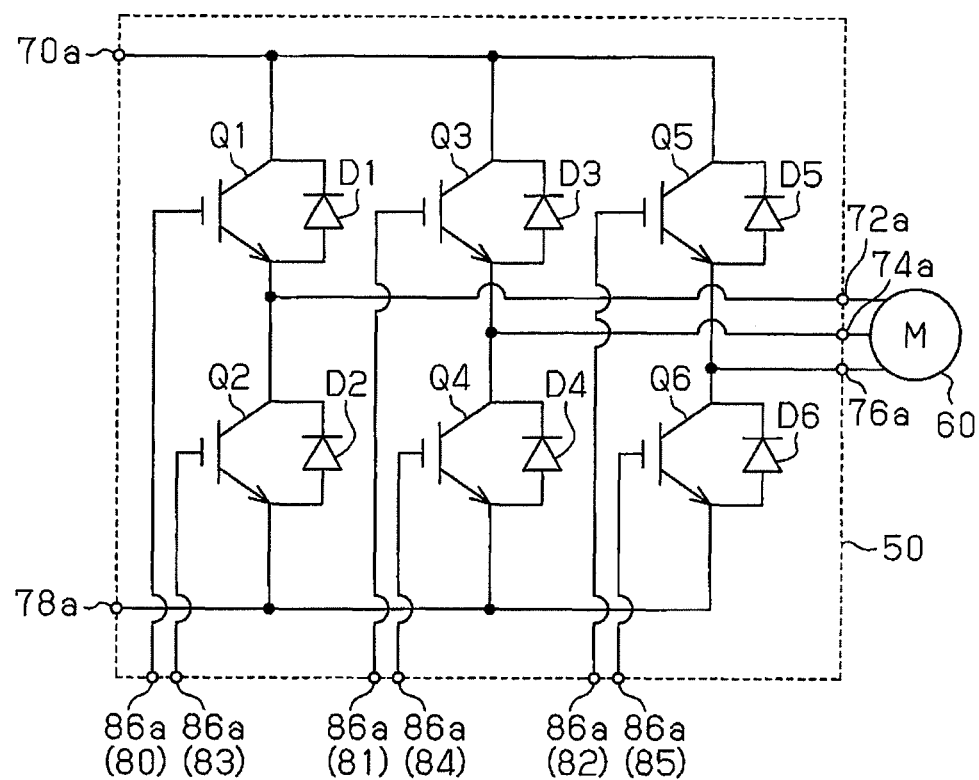
FIG. 3 is a circuit diagram of the inverter module shown in FIG. 1A.

FIG. 3 shows the circuit configuration of the inverter module 10. The inverter module 10 includes an inverter 50, which converts DC power supplied from an external device, to AC power. Then, the inverter 50 supplies the AC power to a travel motor 60. This drives the motor 60, which produces rotation.

In detail, the inverter 50 includes a plurality of arms, namely, a U-phase arm, a V-phase arm, and a W-phase arm arranged in parallel between a power supply line and a ground line. The arms include two series-connected transistors (IGBT) Q1 and Q2, Q3 and Q4, and Q5 and Q6, respectively. Diodes D1, D2, D3, D4, D5, and D6 are arranged between the collector and emitter of the transistors Q1, Q2, Q3, Q4, Q5, and Q6, respectively. Each diode allows for current to pass from the emitter to the collector of the corresponding transistor.

As shown in FIGS. 1A to 2B, the insulating substrates 31, 32, 33, and 34 are formed by direct brazed aluminum (DBA) substrates. Each DBA substrate includes a ceramic substrate 35, an aluminum layer 36, which is formed on a first surface of the ceramic substrate 35, and an aluminum layer 37, which is formed on a second surface of the ceramic substrate 35. The aluminum layer 36 is patterned on the first surface of the ceramic substrate 35. In the same manner, the aluminum layer 37 is patterned on the second surface of the ceramic substrate 35.

Figure 5:
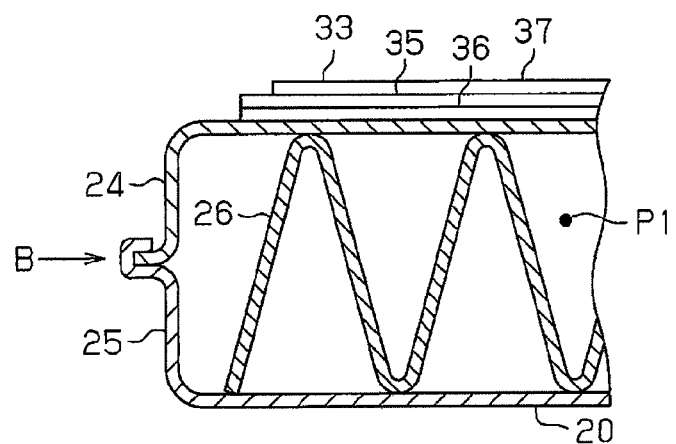
FIG. 5 is a cross-sectional view taken along V-V in FIG. 4B.

The cooling device 20 has the shape of a tetragonal box having a low profile and is formed from aluminum. As shown in FIG. 5, the cooling device 20 includes an upper plate 24, which functions as a first shell plate, a lower plate 25, which functions as a second shell plate, and inner fins 26, which are undulated. A peripheral portion of the upper plate 24 and a peripheral portion of the lower plate 25 are swaged together. In this state, the peripheral portions of the upper plate 24 and the lower plate 25 are brazed to each other. This brazes the upper plate 24 and the lower plate 25 at their peripheral portions in the cooling device 20. A coolant passage P1 is formed between the upper plate 24 and the lower plate 25. The inner fins 26 are also brazed to and between the upper plate 24 and lower plate 25.

In this manner, the cooling device 20 includes a coolant passage P1 (refer to FIG. 5). Coolant is supplied to the cooling device 20 through a pipe (not shown) and discharged from the cooling device 20 through a pipe (not shown).

The four insulating substrates 31, 32, 33, and 34 are brazed to the upper surface (outer surface) of the cooling device 20. In detail, the aluminum layer 36 under the ceramic substrate 35 in each of the four insulating substrates 31, 32, 33, and 34 is brazed and joined with the upper surface of the cooling device 20.

The aluminum layer 37 on the ceramic substrate 35 in the insulating substrate 31 is a wiring material. The transistor (chip) Q1 and the diode (chip) D1 are soldered and joined with the upper surface of the aluminum layer 37. The aluminum layer 37 on the ceramic substrate 35 in the insulating substrate 32 is a wiring material. The transistor (chip) Q3 and the diode (chip) D3 are soldered and joined with the upper surface of the aluminum layer 37. The aluminum layer 37 on the ceramic substrate 35 in the insulating substrate 33 is a wiring material. The transistor (chip) Q5 and the diode (chip) D5 are soldered and joined with the upper surface of the aluminum layer 37. The aluminum layer 37 on the ceramic substrate 35 in the insulating substrate 34 is a wiring material. The transistors (chips) Q2, Q4, and Q6 and the diodes (chips) D2, D4, and D6 are soldered and joined with the upper surface of the aluminum layer 37.

The collector terminals on the upper surfaces of the transistors Q1, Q3, and Q5 and the cathode terminals on the upper surfaces of the diodes D1, D3, and D5 are joined with a conductive plate 70, which functions as an external connection terminal, by solder 71. The collector terminal on the upper surface of the transistor Q2, the cathode terminal on the upper surface of the diode D2, and the aluminum layer 37 in the insulating substrate 31 (the emitter of the transistor Q1 and the anode of the diode D1) are joined with a conductive plate 72, which functions as an external connection terminal, by solder 73. Further, the collector terminal on the upper surface of the transistor Q4, the cathode terminal on the upper surface of the diode D4, and the aluminum layer 37 in the insulating substrate 32 (i.e., the emitter of the transistor Q3 and the anode of the diode D3) are joined with a conductive plate 74, which functions as an external connection terminal, by solder 75. The collector terminal on the upper surface of the transistor Q6, the cathode terminal on the upper surface of the diode D6, and the aluminum layer 37 in the insulating substrate 33 (i.e., the emitter of the transistor Q5 and the anode of the diode D5) are joined with a conductive plate 76, which functions as an external connection terminal, by solder 77. A conductive plate 78, which functions as an external connection terminal, is soldered to the aluminum layer 37 on the ceramic substrate 35 in the insulating substrate 34. The conductive plates 70, 72, 74, 76, and 78 are made of copper. The conductive plates 70, 72, 74, 76, and 78 each include a first end a second end. The first ends of the conductive plates 70, 72, 74, 76, and 78 are electrically connected to the corresponding transistors Q1, Q2, Q3, Q4, Q5, and Q6 and the corresponding diodes D1, D2, D3, D4, D5, and D6.

The second end of the conductive plate 70 is bent upward. In the same manner, the second end of the conductive plate 72 is bent upward. The second end of the conductive plate 74 is bent upward. The second end of the conductive plate 76 is bent upward. The second end of the conductive plate 78 is bent upward.

Six connection pin seats 80, 81, 82, 83, 84, and 85 are fixed to the upper surface the cooling device 20. Three connection pins 86, which function as external connection terminals, are fixed to each of the connection pin seats 80, 81, 82, 83, 84, and 85. The connection pins 86 are made of copper. One of the three connection pins 86 forms a gate voltage application line, and the two remaining connection pins 86 forming an emitter voltage detection line and an emitter temperature detection line. The three connection pins 86 include first terminals electrically connected by wires W formed by a wiring material, or wire-bonded, to the transistors (chips) Q1, Q2, Q3, Q4, Q5, and Q6.

The three connection pins 86 include the first terminals, which are electrically connected to the corresponding transistors Q1, Q2, Q3, Q4, Q5, and Q6, and second terminals, which are bent upward.

The resin portion 40 covers the components arranged on the upper surface of the cooling device 20 (i.e., the insulating substrates 31, 32, 33, and 34, the transistors Q1, Q2, Q3, Q4, Q5, and Q6, the diodes D1, D2, D3, D4, D5, and D6, the conductive plates 70, 72, 74, 76, and 78, the connection pins 86, and the wire W). The conductive plates 70, 72, 74, 76, and 78 include upright portions 70a, 72a, 74a, 76a, and 78a with upper ends exposed from the resin portion 40. In the same manner, the three connection pins 86, which are connected to each of the transistors Q1, Q2, Q3, Q4, Q5, and Q6, include upright portions 86a with upper ends exposed from the resin portion 40. The resin is molded onto a brazed part B (refer to FIG. 5) at the peripheral portions of the upper plate 24 and lower plate 25 in the cooling device 20.

The cooling device 20 includes an exposed lower surface. An electronic component PD1 (refer to FIG. 1A) is arranged on the lower surface of the cooling device 20. The electronic component PD1 generates heat that is transferred to the cooling device 20. In this manner, metal (aluminum) exposed from the lower surface of the cooling device 20 allows for cooling of the electronic component PD1, which is a heat generating body.

The operation of the inverter module 10 will now be described.

Coolant flows through the cooling device 20. The six transistors Q1, Q2, Q3, Q4, Q5, and Q6 of the inverter module 10 each generate heat when performing a switching operation. The six diodes D1, D2, D3, D4, D5, and D6 generate heat when activated. The heat generated by the transistors Q1, Q2, Q3, Q4, Q5, and Q6 is transferred to the cooling device 20 through the insulating substrates 31, 32, 33, and 34 (DBA substrates), which transfer heat to the coolant flowing through the cooling device 20. In the same manner, the heat generated by the six diodes D1, D2, D3, D4, D5, and D6 is transferred to the cooling device 20 through the insulating substrates 31, 32, 33, and 34 (DBA substrates), which transfer heat to the coolant flowing through the cooling device 20.

A method for manufacturing the inverter module 10 will now be described with reference to FIGS. 1A to 2B and FIGS. 4A to 6B.

Figure 4A:
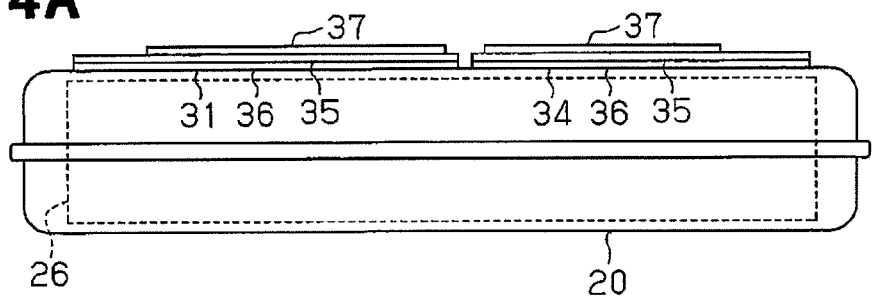
FIG. 4A is a front view showing insulating substrates of the cooling device of FIG. 1A.
Figure 4B:
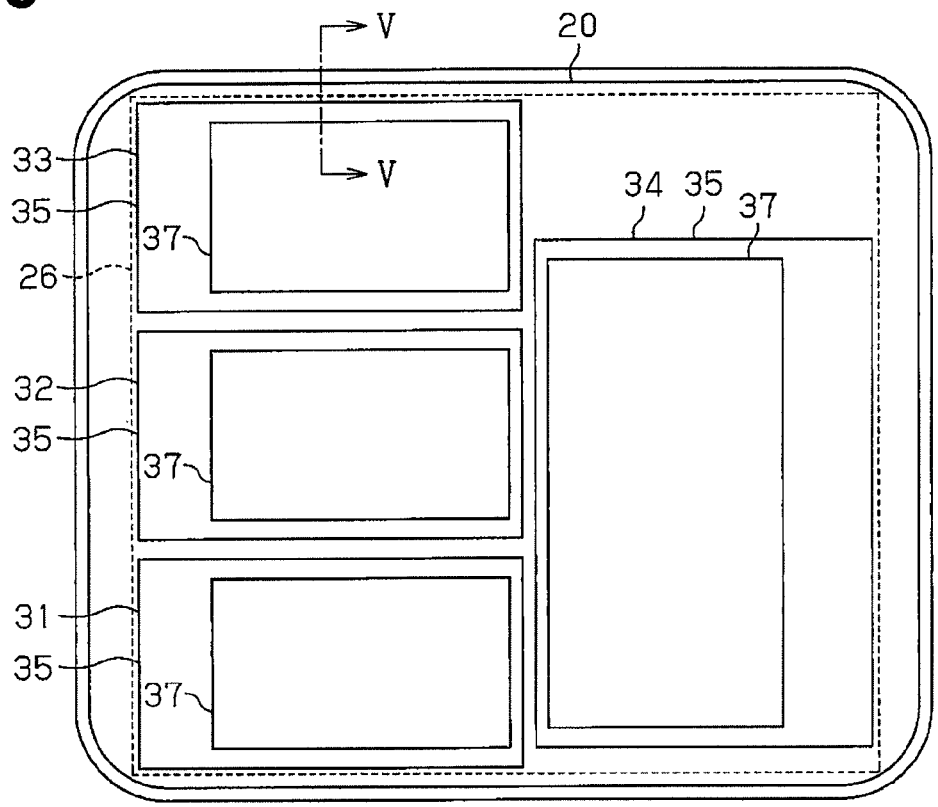
FIG. 4B is a plan view showing the insulating substrates of the cooling device of FIG. 1A.

Referring to FIGS. 4A to 5, the insulating substrates 31, 32, 33, and 34 (DBA substrates) are prepared. The aluminum layer 36 is patterned on one surface of the ceramic substrate 35, and the aluminum layer 37 is patterned on the other surface of the ceramic substrate 35. The peripheral portions of the upper plate 24 and lower plate 25, which form the cooling device 20, are swaged and brazed together. Further, the undulated inner fins 26 are also brazed between the upper plate 24 and the lower plate 25. At the same time, the insulating substrates 31, 32, 33, and 34 (DBA substrates) are brazed to the upper surface of the cooling device 20. In detail, the aluminum layer 36 under the ceramic substrate 35 in each of the four insulating substrates 31, 32, 33, and 34 is brazed to the upper surface of the cooling device 20. The brazing is performed at about 600° C.

Figure 6A:
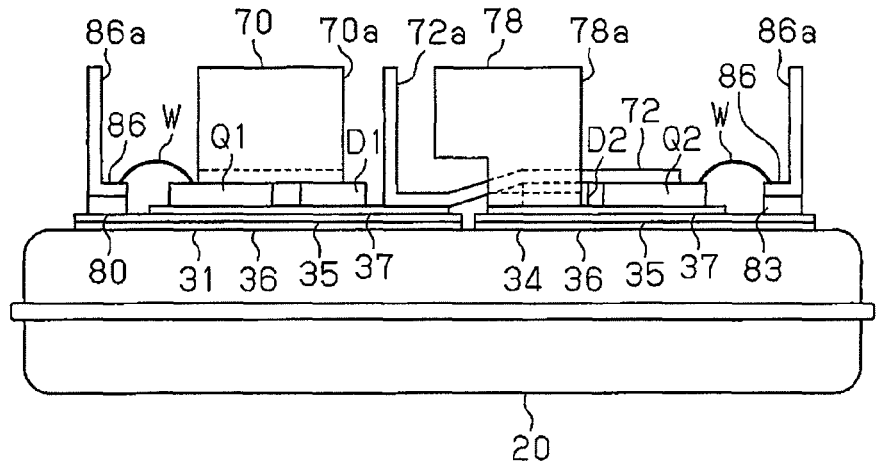
FIG. 6A is a front view illustrating a manufacturing process of the inverter module.
Figure 6B:
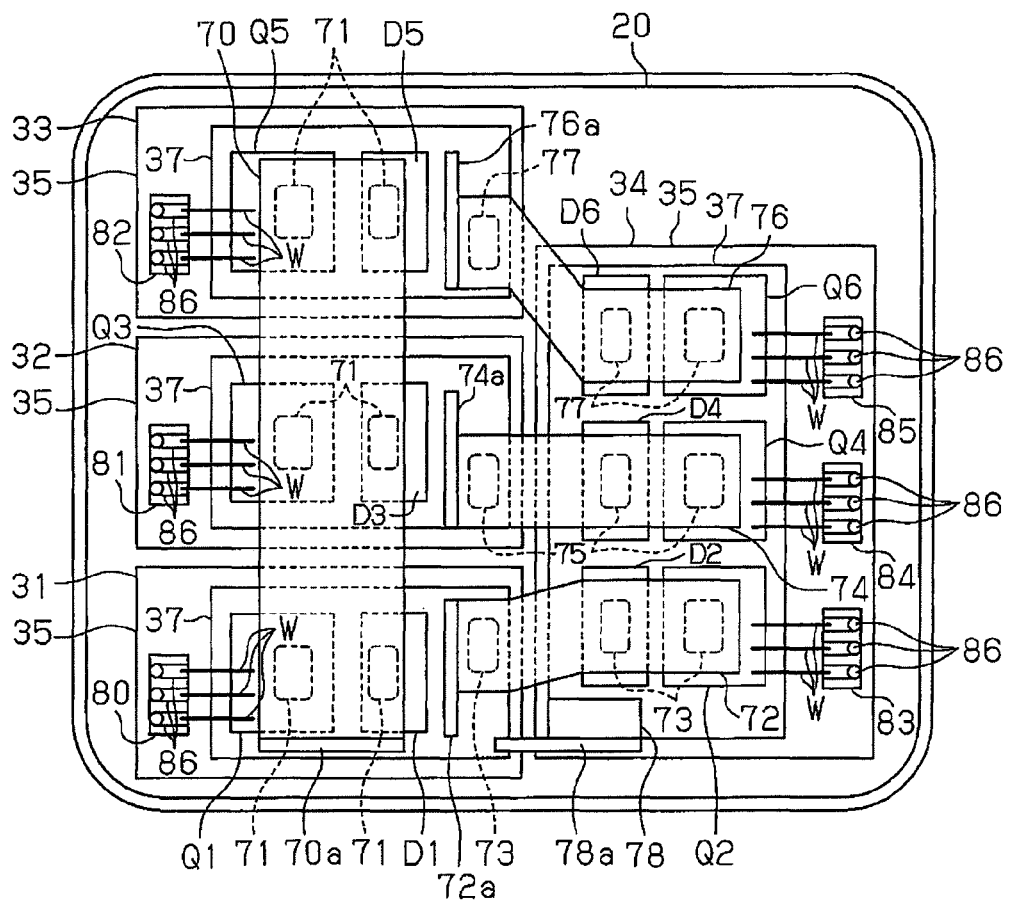
FIG. 6B is a plan view showing the inverter module of FIG. 6A.

Subsequently, referring to FIGS. 6A and 6B, each of the transistors Q1, Q2, Q3, Q4, Q5, and Q6 and each of the diodes D1, D2, D3, D4, D5, and D6 are soldered to the upper surface of the aluminum layer 37 on the ceramic substrate 35 in the corresponding one of the insulating substrates 31, 32, 33, and 34.

At the same time, the conductive plates 70, 72, 74, 76, and 78 are soldered to the transistors Q1, Q2, Q3, Q4, Q5, and Q6 and the diodes D1, D2, D3, D4, D5, and D6. Further, the connection pin seats 80, 81, 82, 83, 84, and 85, on which the connection pins 86 are fixed, are fixed to the upper surface of the cooling device 20.

Further, the connection pins 86 are joined with the corresponding transistors (chips) Q1, Q2, Q3, Q4, Q5, and Q6 by the wire W.

As shown in FIGS. 1A to 2B, the resin portion 40 is used to seal the components mounted on the cooling device 20. The components mounted on the cooling device 20 include the insulating substrates 31, 32, 33, and 34, the transistors Q1, Q2, Q3, Q4, Q5, and Q6, the diodes D1, D2, D3, D4, D5, and D6, the conductive plates 70, 72, 74, 76, and 78 and the wire W. The resin portion 40 is molded at about 120° C.

The above embodiment has the advantages described below.

(1) The inverter module 10, which serves as a semiconductor device, includes the cooling device 20, the insulating substrates 31, 32, 33, and 34, the transistors Q1, Q2, Q3, Q4, Q5, and Q6, the diodes D1, D2, D3, D4, D5, and D6, the conductive plates 70, 72, 74, 76, and 78, and the connection pins 86. The insulating substrates 31, 32, 33, and 34 are brazed to the outer surface of the cooling device 20. Further, in a state in which the second ends of the conductive plates 70, 72, 74, 76, and 78 and the second terminals of the connection pins 86 are exposed, the resin portion 40 is molded to the insulating substrates 31 to 34, the transistors Q1 to Q6, the diodes D1 to D6, the first ends of the conductive plates 70, 72, 74, 76, and 78, the first terminals of the connection pins 86, and at least part of the cooling device 20.

In this manner, the insulating substrates 31, 32, 33, and 34 are brazed (integrated with metal) to the cooling device 20. Further, the semiconductor elements (i.e., the transistors Q1, Q2, Q3, Q4, Q5, and Q6 and the diodes D1, D2, D3, D4, D5, and D6), the conductive plates 70, 72, 74, 76, and 78, and the connection pins 86 are embedded in the resin portion 40 of the cooling device 20. Moreover, the conductive plates 70, 72, 74, 76, and 78 and the connection pins 86 are exposed from the resin portion 40 and integrated by resin as a cooling device module.

The insulating substrates 31, 32, 33, and 34 are brazed to the outer surface of the cooling device 20. This increases the capability for cooling the semiconductor elements (i.e., the transistors Q1, Q2, Q3, Q4, Q5, and Q6 and the diodes D1, D2, D3, D4, D5, and D6). Further, the resin portion 40 is molded to the insulating substrates 31 to 34, the semiconductor elements (i.e., the transistors Q1, Q2, Q3, Q4, Q5, and Q6 and the diodes D1, D2, D3, D4, D5, and D6), the first ends of the conductive plates 70, 72, 74, 76, and 78, the first terminals of the connection pins 86, and at least part of the cooling device 20. This eliminates the need for a dedicated fixing member and allows for reduction in size.

Figure 9:
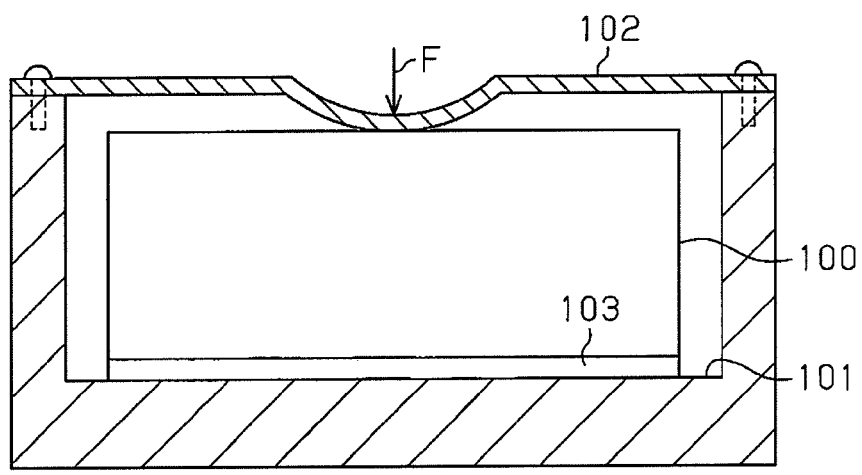
FIG. 9 is a cross-sectional view showing a structure that fixes a heat dissipation member to a module.

In detail, the insulating substrates 31, 32, 33, and 34 are directly joined by metal (integrated by metal) with the cooling device 20. Further, the semiconductor elements (i.e., the transistors Q1, Q2, Q3, Q4, Q5, and Q6 and the diodes D1, D2, D3, D4, D5, and D6) are soldered to the insulating substrates 31, 32, 33, and 34. This allows for direct cooling of the semiconductor elements and increases the cooling capability. Further, the integration of the entire cooling device 20 with the resin portion 40 improves reliability. Moreover, the sealing of the entire cooling device 20 with the resin portion 40 eliminates the need for a fixing structure and allows for reduction in size. In this manner, the molding of resin onto members including the cooling device 20 allows for reduction in size, which would not be possible when using a fixing bracket 102 (pushing member) as shown in FIG. 9. Further, the silicone grease 103 of FIG. 9 becomes unnecessary.

In this manner, the resin portion 40 improves the reliability at joined portions of elements, increases the cooling capability, and allows for reduction in size.

(2) In the cooling device 20, the peripheral portions of the upper plate 24 and lower plate 25 are brazed together, and the coolant passage P1 is formed between the upper plate 24 and lower plate 25. Resin is molded to the brazed part B at the peripheral portions of the upper plate 24 and lower plate 25. This improves the seal of the upper plate 24 and lower plate 25.

In this manner, the resin portion 40 covers the side surfaces of the cooling device 20. This is preferable for increasing the seal (waterproof seal) of the cooling device.

(3) The semiconductor device manufacturing method includes a brazing step, a subsequent soldering step, and a subsequent molding step. Referring to FIGS. 4 and 5, the brazing step joins the peripheral portions of the upper plate 24 (first shell plate) and lower plate 25 (second shell plate), which form the cooling device 20. The brazing step also joins the insulating substrates 31, 32, 33, and 34. Referring to FIGS. 6A and 6B, the soldering step mounts the transistors Q1 to Q6 and diodes D1 to D6, which function as semiconductor elements, on the insulating substrates 31, 32, 33, and 34, and joins the transistors Q1 to Q6, which function as semiconductor elements, with the first ends of the conductive plates 70, 72, 74, 76, and 78, which function as external connection terminals. Referring to FIGS. 1A to 2B, the molding step molds the resin portion 40 to the insulating substrates 31, 32, 33, and 34, the transistors Q1 to Q6, the diodes D1 to D6, the first ends of conductive plates 70, 72, 74, 76, and 78, and at least part of the upper plate 24, while exposing the second ends of the conductive plates 70, 72, 74, 76, and 78. The molding of the resin portion 40 improves the reliability of joined portions of elements and increases the cooling capability. Further, the inverter module 10 can be reduced in size.

It should be apparent to those skilled in the art that the present invention may be embodied in many other specific forms without departing from the spirit or scope of the invention. Particularly, it should be understood that the present invention may be embodied in the following forms.

Figure 7:
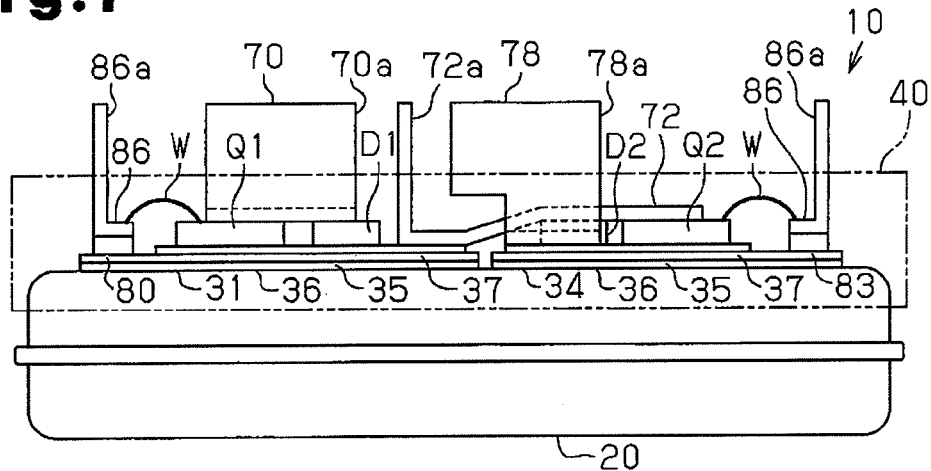
FIG. 7 is a front view showing a modification of an inverter module.

Referring to FIG. 7, instead of entirely sealing the side surfaces of the cooling device 20 with the resin portion 40, the side surfaces of the cooling device 20 may be partially sealed by the resin portion 40.

Figure 8:
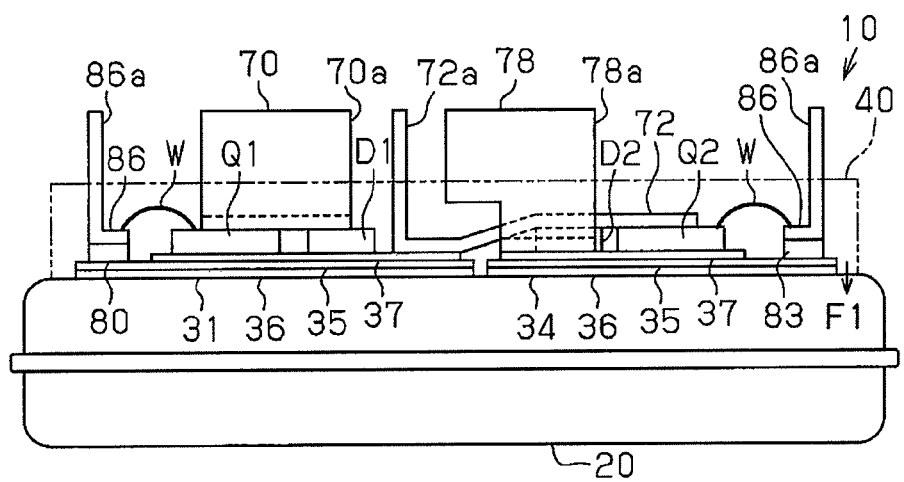
FIG. 8 is a front view showing a modification of an inverter module.

Referring to FIG. 8, instead of sealing the side surfaces of the cooling device 20 with the resin portion 40, the resin portion 40 may seal only the upper surface of the cooling device 20. This decreases the area of contact between the cooling device 20 and the resin portion 40 and lowers the force F1 applied to the cooling device 20 by the resin portion 40. Thus, deformation of the cooling device 20 caused by an external force is suppressed. Further, the amount of the resin can be decreased.

Although the insulating substrates 31, 32, 33, and 34 are DBA substrates, the insulating substrates may be direct brazed copper (DBC) substrates, each including a ceramic substrate 35 sandwiched by copper layers.

Although the present invention is applied to an inverter that functions as a power conversion device, the invention may be applied to other types of power conversion device, such as a converter.

The present examples and embodiments are to be considered as illustrative and not restrictive, and the invention is not to be limited to the details given herein, but may be modified within the scope and equivalence of the appended claims.

The invention claimed is:

1. A semiconductor device, comprising:
   a cooling device including a coolant passage;
   an insulating substrate connected to the cooling device;
   a semiconductor element connected to the insulating substrate by a soldered connection;
   an external connection terminal including a first end, which is electrically connected to the semiconductor element, and an opposite second end; and
   a resin portion molded to the insulating substrate, the semiconductor element, the first end of the external connection terminal, and at least part of the cooling device, the resin portion directly contacting at least part of the cooling device, wherein
   the cooling device includes a first shell plate and a second shell plate, each including peripheral portion,
   the insulating substrate is connected to an outer surface of one of the first shell plate and the second shell plate by a brazed connection,
   the resin portion is molded to a portion of the brazed connection, the brazed connection being between the insulating substrate and the outer surface of the one of the first shell plate and the second shell plate,
   the peripheral portion of the first shell plate is connected to the peripheral portion of the second shell plate by a second brazed connection to integrate the first shell plate and the second shell plate, and
   the coolant passage is formed between the first shell plate and the second shell plate.

2. The semiconductor device according to claim 1, wherein the resin portion is molded in a state in which the second end of the external connection terminal is exposed from the resin portion.

3. The semiconductor device according to claim 1, wherein the resin portion is molded to a portion of the second brazed connection, the second brazed connection being between the first shell plate and the second shell plate.

4. The semiconductor device according to claim 1, wherein the resin portion is molded to at least a top outer surface and a side outer surface of the one of the first shell plate and the second shell plate to which the insulating substrate is connected.

5. The semiconductor device according to claim 1, wherein the resin portion is molded to at least a portion of a surface of the insulating substrate opposite the brazed connection that is between the insulating substrate and the outer surface of the one of the first shell plate and the second shell plate.

6. The semiconductor device according to claim 1, wherein the soldered connection is on a surface of the insulating substrate opposite the brazed connection that is between the insulating substrate and the outer surface of the one of the first shell plate and the second shell plate.

7. The semiconductor device according to claim 6, wherein the brazed connection is wider than the soldered connection.

* * * * *